(12) United States Patent
Arnold et al.

(10) Patent No.: US 7,924,007 B2
(45) Date of Patent: Apr. 12, 2011

(54) METHOD FOR AUTOMATIC COIL SELECTION IN A MAGNETIC RESONANCE APPARATUS

(75) Inventors: Thomas Arnold, Nürnberg (DE); Swen Campagna, Engelthal (DE)

(73) Assignee: Siemens Aktiengesellschaft, Munich (DE)

( * ) Notice: Subject to any disclaimer, the term of this patent is extended or adjusted under 35 U.S.C. 154(b) by 221 days.

(21) Appl. No.: 12/038,945

(22) Filed: Feb. 28, 2008

(65) Prior Publication Data
US 2008/0211502 A1 Sep. 4, 2008

(30) Foreign Application Priority Data

Mar. 2, 2007 (DE) .......................... 10 2007 010 274

(51) Int. Cl.
*G01V 3/00* (2006.01)
(52) U.S. Cl. ........ 324/309; 324/310; 324/318; 600/410; 600/422
(58) Field of Classification Search .......... 324/300–322; 600/410–423
See application file for complete search history.

(56) References Cited

U.S. PATENT DOCUMENTS

| | | | | |
|---|---|---|---|---|
| 6,289,232 B1 * | 9/2001 | Jakob et al. | .......... | 324/309 |
| 6,298,259 B1 * | 10/2001 | Kucharczyk et al. | .......... | 600/411 |
| 6,624,633 B1 * | 9/2003 | Zou et al. | .......... | 324/318 |
| 7,123,008 B1 * | 10/2006 | Damadian et al. | .......... | 324/309 |
| 7,141,976 B2 * | 11/2006 | Campagna | .......... | 324/318 |
| 7,375,521 B1 * | 5/2008 | Damadian et al. | .......... | 324/307 |
| 7,511,489 B2 * | 3/2009 | Fautz et al. | .......... | 324/307 |
| 2005/0054910 A1 * | 3/2005 | Tremblay et al. | .......... | 600/411 |
| 2005/0253584 A1 | 11/2005 | Campagna | .......... | 324/318 |
| 2005/0264288 A1 | 12/2005 | Campagna et al. | .......... | 324/309 |
| 2005/0275402 A1 | 12/2005 | Campagna | .......... | 324/309 |
| 2006/0147492 A1 * | 7/2006 | Hunter et al. | .......... | 424/426 |
| 2006/0238192 A1 * | 10/2006 | Ham | .......... | 324/307 |
| 2006/0261810 A1 * | 11/2006 | Fautz et al. | .......... | 324/309 |
| 2007/0016003 A1 * | 1/2007 | Piron et al. | .......... | 600/415 |
| 2007/0210793 A1 | 9/2007 | Kiefer | .......... | 324/307 |
| 2008/0211502 A1 * | 9/2008 | Arnold et al. | .......... | 324/318 |
| 2009/0280153 A1 * | 11/2009 | Hunter et al. | .......... | 424/423 |
| 2010/0079141 A1 * | 4/2010 | Stemmer | .......... | 324/309 |

* cited by examiner

*Primary Examiner* — Melissa J Koval
*Assistant Examiner* — Tiffany A Fetzner
(74) *Attorney, Agent, or Firm* — Schiff Hardin LLP (57) ABSTRACT

In a method for coil selection of a magnetic resonance apparatus, a determination of coil positions of the multiple coil devices of the magnetic resonance apparatus is made and a determination is also made of a number of coil groups, wherein a coil group is composed of at least one coil device. One or more coil groups is associated with positions of the support device, and the coil group that is associated with a position of the support device includes the coil devices that are suitable for use in that associated position of the support device. A control of one of the multiple coil groups dependent on the position of the support device.

23 Claims, 3 Drawing Sheets

FIG 2

METHOD FOR AUTOMATIC COIL SELECTION IN A MAGNETIC RESONANCE APPARATUS

BACKGROUND OF THE INVENTION

1. Field of the Invention

The present invention concerns a method and a device for coil selection of a magnetic resonance apparatus and in particular for coil selection of a magnetic resonance apparatus in which the patient support device is moved continuously through the magnetic resonance apparatus during an examination of a subject.

2. Description of the Prior Art

In addition to a whole-body acquisition coil (also known as a body coil) that is permanently installed behind the tunnel cowling in a magnetic resonance apparatus, modern magnetic resonance apparatuses also have a number of local acquisition coils (also known as local coils). In an imaging examination with the magnetic resonance apparatus, the local coils deliver a measurement signal with significantly better signal-to-noise ratio than the whole-body acquisition coil, since the local coils can be placed directly on or optimally close to the body of the patient or the subject to be examined. Moreover, the signals of the local coils are less significantly disrupted by other system components of the magnetic resonance apparatus.

However, the use and the increasing number of the employed local coils and their placement along the body of the patient or the subject to be examined require an ever-greater time expenditure on the part of the technician for planning the examination. After the positions of the local coils have been determined relative to the patient, or relating to a support device on which the patient lies (such as by using a method disclosed in, for example, DE 10 2004 022 559 for determination of the position of a local coil), a subset of the employed local coils is selected such that the local coils define an acquisition region which encompasses the region to be examined (also called the field of view (FoV). The acquisition region of the coils is limited on the one hand by the homogeneity region of the magnetic resonance system and by regions of increased resolution which are bounded by the acquisition regions of the local coils. The homogeneity region can be, for example, a spherical volume of, for example, 50 cm in diameter within the magnetic resonance system.

During the measurement of a volume to be examined, the use of all arranged local coils can lead to additional noise signals or even interference signals from the local coils that are unsuitable for this region, and thus the image quality of the examination result is degraded. Moreover, magnetic resonance apparatuses typically have only a limited number of acquisition channels to which the local coils can be connected. A limitation of the selected local coils is thus also necessary for this reason.

The problem of the suitable coil selection is particularly important in measurements with continuous table movement, known as continuous table movement measurements or CTM measurements. Under the circumstances a very large examination region (which is also called a virtual large field of view (virtual large FoV)) that can be composed of a number of the aforementioned FoVs, is traversed during the continuous table movement. This can, for example, pertain to the entire body of the patient and thus exhibit a length of over 200 cm.

SUMMARY OF THE INVENTION

An object of the present invention is to provide a method and a device that allow a coil selection and a coil activation in a magnetic resonance apparatus that are suitable for an examination of a subject that is moved continuously through a number of regions within the magnetic resonance apparatus together with the support device during an examination.

This object is achieved in accordance with the present invention by a method for coil selection of a magnetic resonance apparatus which has a number of coil devices for generation of an alternating magnetic field for nuclear magnetic resonance excitation and/or for acquisition of the field emanating from excited nuclear spins and a support device for a subject to be examined. The support device is moved continuously through a number of positions or regions within the magnetic resonance apparatus during an examination of the subject. The terms "region" and "position" of the support device are used synonymously herein and designate the arrangement of the support device in relation to the magnetic resonance apparatus during the continuous movement of the support device through the magnetic resonance apparatus. The coil devices can be arranged on the support device or the subject to be examined (such as, for example, a patient), meaning that they are moved through the magnetic resonance apparatus together with the support device and the subject to be examined during an examination. These coil devices are also designated as local coils. Alternatively, the coil devices can be arranged stationary at the tunnel of the magnetic resonance apparatus. It is also possible for some of coil devices to be arranged stationary relative to the magnetic resonance apparatus and some additional coil devices to be arranged on the support device or the subject to be examined and thus in a position that is variable relative to the magnetic resonance apparatus.

The method for coil selection includes a determination of the coil positions of multiple coil devices. The coil positions with regard to the coil devices that are attached stationary on the magnetic resonance apparatus are determined from inherent information of the magnetic resonance apparatus. The coil positions of the coil devices arranged on the support devices or the subject to be examined can be determined, for example, with a method (such as described in DE 10 2004 022 559) according to the prior art, such that the positions of each coil device can be determined relative to the positions of the support device through which the support device is moved through the magnetic resonance apparatus.

The method also includes a determination of a number of coil groups, whereby a coil group is formed by at least one coil device. One coil group among the multiple coil groups is associated with the respective regions or positions of the support device. A coil group that is associated with a region or a position of the support device includes the coil device or devices that is or are suitable for use in that associated region of the support device.

The method also includes controlling one of the multiple coil groups dependent on the region or the position of the support device during the examination of the subject.

In accordance with this method, given a continuous movement of the support device, precisely that group of coil devices that is suitable for the corresponding position or the corresponding region of the support device (i.e. that group that is suitable in this position or this region for examination of the field of view) is used for imaging at every point in time of the examination. In particular, those coil devices which would generate only noise signals or even interference signals due to their current position relative to the magnetic resonance apparatus are not included in the group that is currently un use for acquiring imaging data. A good image quality is thereby ensured and a fast examination of a large examination region is achieved by the continuous movement of the support device. Moreover, both the coil devices that are stationary relative to the magnetic resonance apparatus and coil devices arranged on the support device or the subject to be examined are taken into account and possibly employed in the aforementioned method, and a best possible imaging is thus ensured.

According to a further embodiment of the invention, the method also includes a determination of a type of a coil device among the multiple coil devices. The use at and association of the coil device with a position or a region of the support device can additionally be determined by the use of the type information of the respective coil devices. The usage location of the coil devices thus can be determined more precisely and thus the imaging can be further improved.

According to a further embodiment of the present invention, the number of coil groups is determined before the beginning of the examination. Because the coil groups are determined before the beginning of the examination, it can already be established before the beginning of the examination whether the specific coil groups can be implemented in the desired configuration with the present infrastructure or hardware of the magnetic resonance apparatus. For example, it may be possible that not all combinations of employed coil devices required by the coil groups can be activated due to the limited number of acquisition channels of the magnetic resonance apparatus or a limited interconnection capability of switching matrix that interconnects the coil devices with the acquisition channels of the magnetic resonance apparatus. In such a case, it may be necessary for the number of the coil groups to be reduced in order to be able to implement the examination with the available infrastructure or hardware. For this purpose, for example, a first coil group and a second coil group of the multiple coil groups are combined into a new coil group and this new coil group is associated with the regions (now as a single or combined region) of the support device with which the first coil group or the second coil group were previously associated.

According to a further embodiment of the invention the multiple coil groups are determined during the examination. This is particularly advantageous when an a priori determination of the coil groups is not reasonable, such as when one coil group of a position still to be examined must be determined dependent not only on the position to be examined but also dependent on a previous examination result. This can be necessary, for example, given the use of contrast agents in the subject to be examined, when the distribution of the contrast agent within the subject to be examined is not precisely predictable and thus the coil groups are to be suitably selected dependent on the current contrast agent distribution.

According to a further embodiment, two coil groups that are associated with two adjacent regions of the support device include at least one coil device that is present in each of the two coil groups.

Since one goal of CTM measurements is the subsequent fusion of the individual partial images that were acquired in the various regions during the CTM measurement into a combined image, an optimally high homogeneity of the image is particularly important in order to be able to relate different image regions with one another. Discontinuities in the image brightness, the contrast or in the signal-to-noise ratio at the border of data acquisitions with different coil groups in particular make the image-based diagnosis more difficult for the viewer. A more homogeneous transition is achieved by the adjacent coil groups not being entirely disjoint, but rather coinciding (merging) in a portion of their respective coil devices. A minimum number of common coil devices can, for example, be one, two, three or four coil devices.

According to a preferred embodiment, the support device traverses a first position and a second position of the support device, the first position and a second position of the support device being adjacent to one another. A first coil group is associated with the first position and a second coil group is associated with the second position. The first coil group exhibits a first detection region of the coils thereof and the second coil group exhibits a second detection region of the coils thereof. The coil groups are selected such that at least a portion of the first detection region comprises a portion of the second detection region. This over-lapping detection region, from which data are acquired in common, can encompass, for example, at least 20%, at least 30% or at least 50% of the second detection region.

A "detection region" of a coil group is an acquisition region of the coils of that coil group for a coil group that includes receiving coils, and is a transmission and acquisition region of the coils of that coil group for a coil group that includes both receiving and transmitting coils.

By virtue of the detection regions of two adjacent coil groups geometrically overlapping one another, a homogeneous transition is achieved in the respective magnetic resonance exposures upon transition from the first coil group to the second coil group. The diagnosis is thereby made easier for the viewer.

In embodiments of the present invention the selection of the individual coil device or devices can be designed to configure an overall coil device produced as a result of the selection to function as a head coil device, a chest coil device, a neck coil device, a leg coil device, a spinal column coil device, or a whole-body coil device.

The above object also is achieved in accordance with the present invention by a magnetic resonance system that has a support device for a subject to be examined, a number of coil devices for generation of an alternating magnetic field for magnetic resonance excitation and/or for acquisition of the field emanating from the excited nuclear spins; a drive unit for movement of the support device; a detection unit that detects position information as to the respective positions of the coil devices to a control device that controls the drive unit and the coil devices, and a processing unit. The processing unit is connected with the detection unit and the control unit and identifies the coil positions of the individual coil devices among the multiple coil devices from the information provided by the detection unit. An operator designates an examination region of the subject to be examined via an operating unit of the magnetic resonance system and the processing unit thereupon determines a number of coil groups, each coil group including at least one coil device and being associated with one or more positions of the support device. A coil group, which is associated with one or more positions of the support device, is automatically selected that contains the coil devices that are suitable for use in the associated position or the associated positions of the support device. The processing unit activates the control device to cause the support device to be moved continuously through the magnetic resonance system and one or more coil groups are simultaneously activated dependent on the position occupied by the support device.

The advantages of the inventive magnetic resonance system correspond to the advantages of the inventive method, and therefore need not be repeated.

Moreover, the present invention encompasses a computer program product (a computer-readable medium encoded with a data structure, i.e., programming instructions) which can be loaded into a memory of a programmable controller of a magnetic resonance system. All embodiments of the inventive method described in the preceding can be executed with the programming instructions of this computer program product when it runs in the control device.

The computer-readable data medium can be a CD or DVD on which an electronically-readable control information (in particular software) is stored.

DESCRIPTION OF THE PREFERRED EMBODIMENTS

Figure 1:
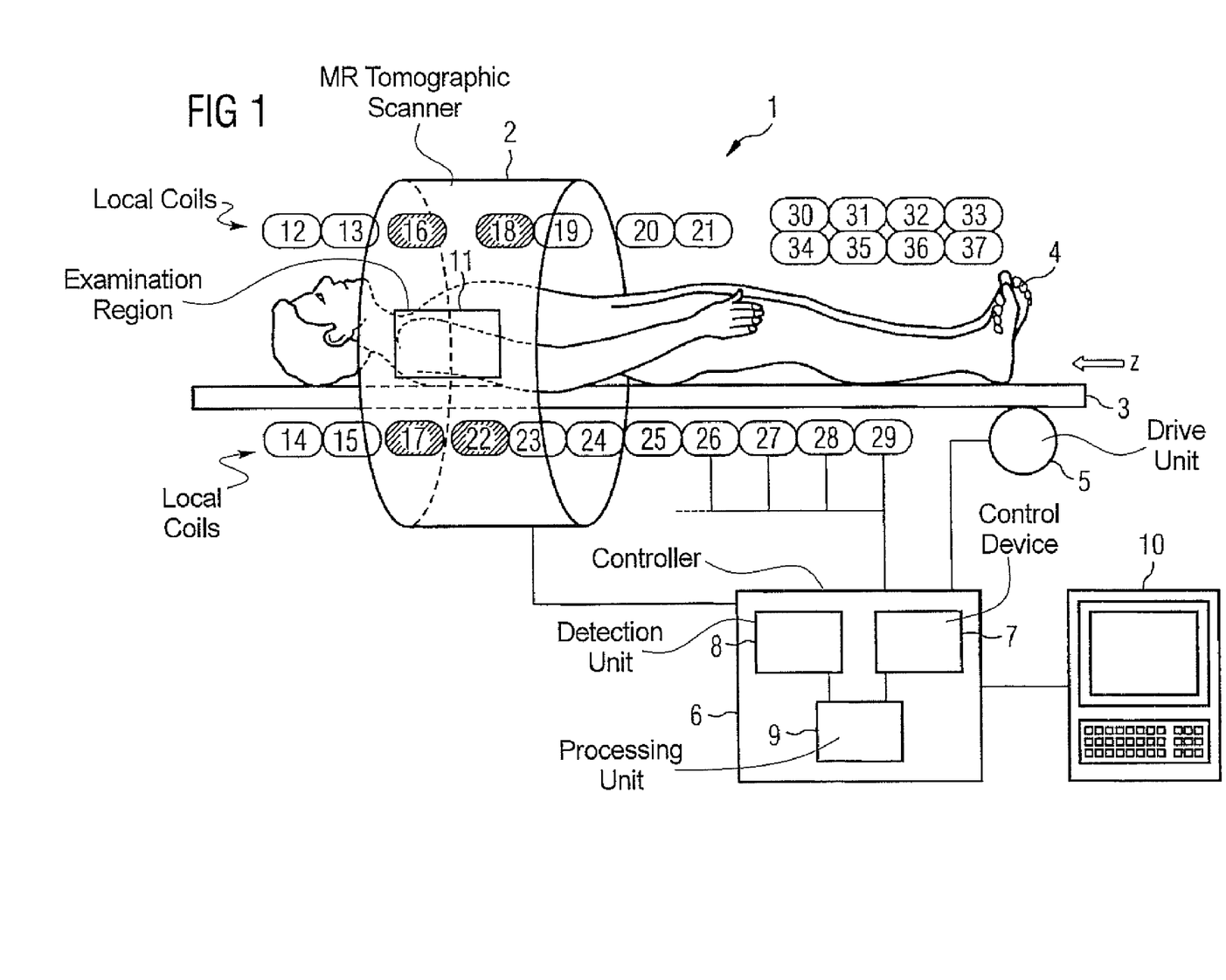
FIG. 1 is a schematic representation of a magnetic resonance system and a subject or a patient to be examined therein, constructed and operating in accordance with the present invention.

FIG. 1 shows a magnetic resonance system that includes the actual tomographic scanner 2 and a support device 3. A subject 4 (for example a patient) to be examined is arranged on the support device 3. The support device 3 is driven by a drive unit 5 such that the support device 3 can be moved forward and back in the z-direction (as indicated by the arrow shown in FIG. 1) such that the subject 4 is driven through the scanner 2. The magnetic resonance system also includes a magnetic resonance system controller 6 that has a control device 7, a detection unit 8 and a processing unit 9. The magnetic resonance system also has an operating unit 10 which is connected with the magnetic resonance system controller 6 and provides a control interface for operation of the magnetic resonance system. A region 11 which encompasses the examination region of the scanner 2 is defined within the scanner 2. This examination region 11 is also called a field of view (FoV). This FoV represents the region to be examined that is desired by the user. During the examination the support device 3 is driven through the scanner 2 and thus the examination region 11 "migrates" over the subject 4 to be examined, such that an elongated examination region results by a combination of the examination regions 11 at each point in time.

In the scanner 2, a number of coils (not shown) generate a temporally constant magnetic field for polarization of the atomic nuclei in the subject 4 to be examined. These coils surround a cylindrical hollow space into which the subject 4 to be examined is inserted for a magnetic resonance measurement. A further cylindrical gradient coil (not shown) is concentrically inserted into this hollow space and has three sub-windings that each generates a gradient field proportional to the respective applied current, these gradient fields being spatially orthogonal. A radio-frequency whole-body coil (not shown) is located within the gradient coil, this radio-frequency coil having the function of transducing RF pulses emitted by a power transmitter into an alternating magnetic field for excitation of the atomic nuclei and subsequently transducing the alternating field emanating from the precessing nuclear spins into a voltage that is further processed by the magnetic resonance system controller 6 to generate image information. Special regionally sensitive local coils 12-37 are used for signal acquisition dependent on the region of the subject 4 to be examined. These local coils can be arranged on either the support device 3 or the subject 4 to be examined.

Moreover, the local coils 12-37 are suitably connected with the magnetic resonance system controller 6 via, for example, electrical, optical or radio connections. Although in FIG. 1 only the local coils 26-29 are graphically shown as being connected with the magnetic resonance system controller 6, the remaining local coils 12-25 and 30-37 are also connected (or connectable) with the magnetic resonance system controller 6. Corresponding connection lines are omitted for clarity.

The magnetic resonance system 1 is able to move the subject 4 to be examined continuously through the scanner 2 while magnetic resonance measurements are simultaneously implemented with the local coils 12-37. For this purpose, the positions of the local coils 12-37 are initially determined with the detection unit 8 of the magnetic resonance system controller 6. A method suitable for this purpose is disclosed in DE 10 2004 022 559. According to this method the position of a local coil 12-37 on the support device 3 is determined in a spatial direction z within the magnetic resonance scanner 2 (in which a radio-frequency signal is emitted in a magnetic field gradient applied in the appertaining spatial direction z and a signal profile is measured along the magnetic field gradient by means of the appertaining local coil 13-37). Respective signal profiles are measured along the magnetic field gradient at a number of positions of the support device 3 relative to the scanner 2 and the respective positions of the local coils 12-37 is determined on the basis of the measured signal profiles.

Through the operating unit 10, a user provides the magnetic resonance system with a region of the subject 4 to be examined. The processing unit 9 of the magnetic resonance system controller 6 now determines a number of coil groups (wherein a "coil group" includes at least one local coil) and associates one or more coil groups with the positions of the support device 3. The coil group that is associated with a position of the support device 3 is composed of the local coils (or coil) that are (or is) suitable for use in the associated position of the support device 3. In this context "suitable" means that the local coils or coil have or has a detection region that encompasses the desired examination region for this position of the support device 3. The totality of all examination regions that are defined by the positions of the support device 3 and the associated coil groups is co-extensive with the entire examination region desired by the user (virtual, large FoV).

After the coil groups have been determined, the subject 4 to be examined (together with the support device 3) is moved continuously through the scanner 2 from a starting position of the region to be examined to an end position of the region to be examined. During this passage the processing unit 9 activates the control device 7 such that the control device 7 implements a continuous movement of the support device 3 in the desired region by the operation of the drive unit 5 and activates, at each position of the support device 3, precisely the coil group that is associated with the corresponding position of the support device 3.

Figure 2:
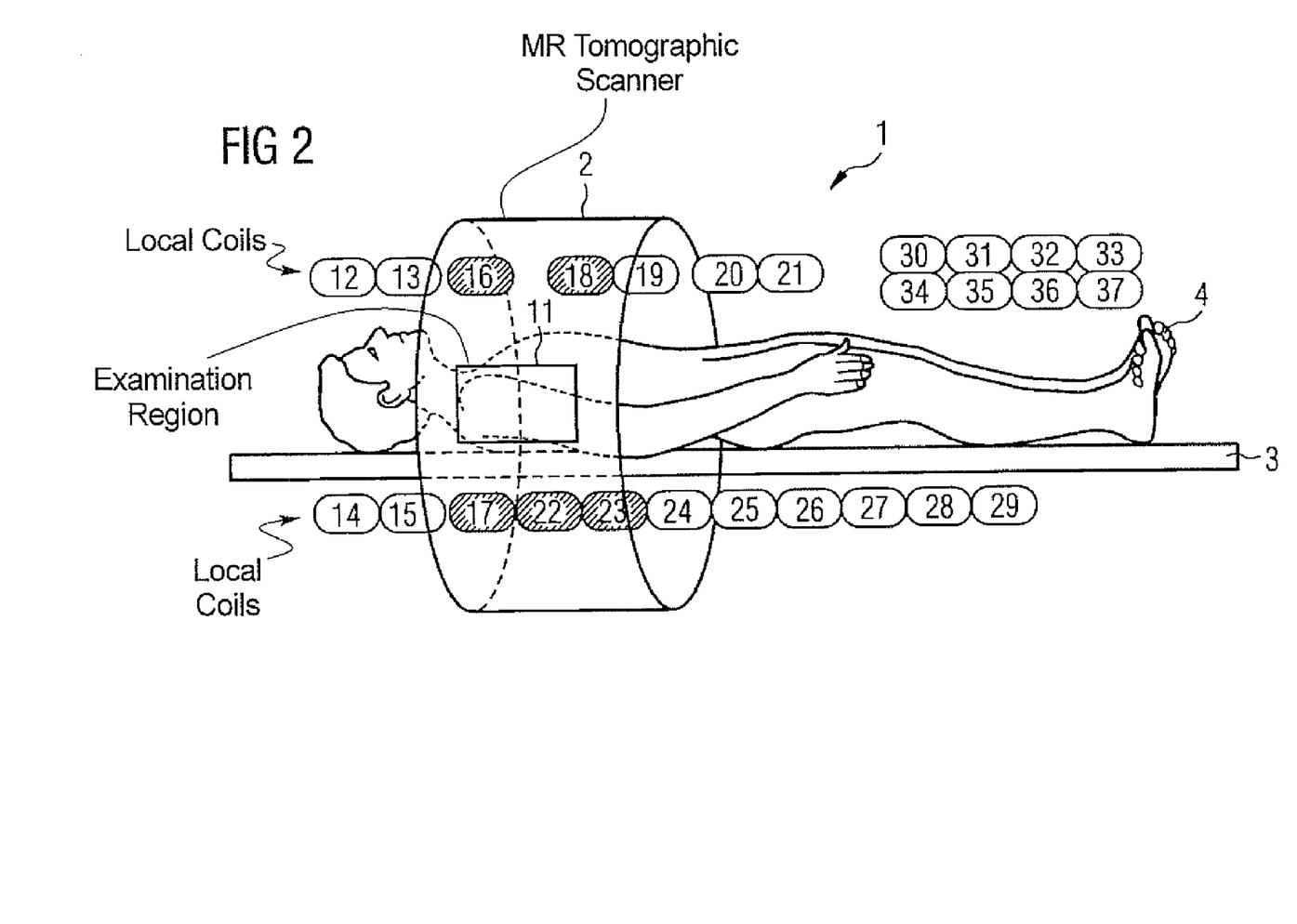
FIG. 2 is a schematic representation of the inventive magnetic resonance system of FIG. 1, wherein the support device is located in a different position.

FIG. 1 shows a first position of the support device 3 in which the local coils 16, 17, 18 and 22 are used. This group of local coils represents a first coil group which is associated with the position of the support device shown in FIG. 1. The same magnetic resonance system 1 is shown in FIG. 2, wherein the support device 3 has been moved by the drive unit 5 into a second position in the z-direction. In this second position of the support device 3, a second group of local coils that is composed of the local coils 16, 17, 18, 22 and 23 is activated. Further groups of local coils are activated in further positions of the support device 3 until finally the position of the support device 3 shown in FIG. 3 is reached in which a further-coil group is activated that is composed of the local coils 21, 26, 27, 28, 30 and 34.

Figure 3:
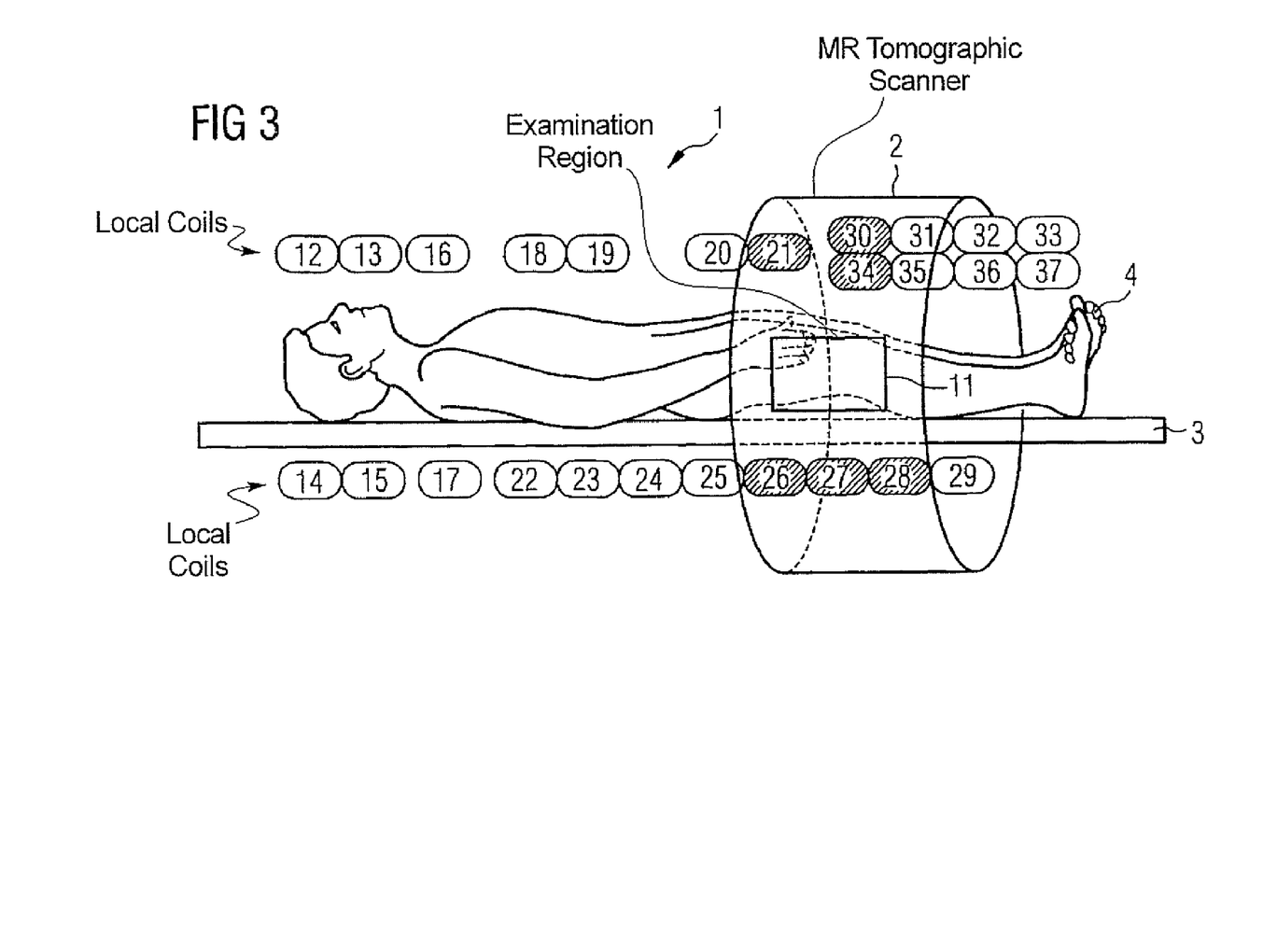
FIG. 3 is a schematic representation of the inventive magnetic resonance system of FIG. 1, wherein the support device is located yet another position.

The magnetic resonance system 1 is thus suitable to generate magnetic resonance exposures given a continuous movement of the support device 3, these magnetic resonance exposures depicting an examination region that (in the example presented above) extends from the examination region 11 of FIG. 1 to the examination region 11 of FIG. 3. Moreover, given suitable use of all local coils 12-37 an examination region can be implemented over the entire length of the subject 4 to be examined extending in the z-direction.

Since, given a change from one coil group to the next coil group (for example from the coil group 16, 17, 18, 22 shown in FIG. 1 to the coil group 16, 17, 18, 22, 23 shown in FIG. 2) some local coils (in this case 16, 17, 18, 22) are used in an overlapping manner, a homogeneous transition of the images of the first group and the second group is achieved.

Although only local coils 12-37 are activated during the continuous passage of the support device 3 in the example presented above, coil devices that are installed stationary on the scanner 2 can moreover also be activated insofar as these can be suitably used for an image generation in specific positions.

After the positions of the individual local coils 12-37 have been determined, the determination of the coil groups and the association of the coil groups with the positions of the support device 3 (and thus the determination of the switch-over point in time or switch-over positions between the various coil groups) during a passage of the support device 3 through the scanner 2 can either be established for the entire examination at the beginning of the magnetic resonance examination or be established dependent on current examination results during the passage of the support device 3 through the scanner 2. A determination and association of the coil groups during the passage dependent on current examination results of the magnetic resonance system is in particular suitable given the use of contrast agents in the subject to be examined in order to be able to better track the course of the contrast agent through a suitable determination of coil groups. For example, whether the use of a chest coil or a spinal column coil delivers a better examination result can thus be different from case to case dependent on the distribution of a contrast agent in the subject to be examined.

Although the method disclosed in DE 10 2004 022 559 was previously used for determination of the positions of the local coils 12-37, any other suitable method can be used such as, for example, a method in which the coil positions are determined by plug positions in the support device 3 or a manual method in which the coil positions are input into the magnetic resonance system controller 6 through an input unit of the operating unit 10.

In the procedure described above discontinuities in the image brightness, the contrast or the signal-to-noise ratio have also been avoided at the boundaries between exposures from different coil groups, by one or more coil groups having been used in common in adjacent coil groups. Alternatively or additionally, such discontinuities can also be avoided by the individual examination regions 11 or the detection regions of respective adjacent coil groups exhibit a minimal geometric overlap. This is, for example, present in the comparison of the examination regions 11 of FIGS. 1 and 2 in which the shoulder region of the patient 4 is covered both by the examination region 11 of a first coil group of FIG. 1 and by the examination region 11 of a second coil group of FIG. 2.

Since relatively many local coils 12-37 are used particularly in a whole-body measurement (as shown in FIG. 1), but many magnetic resonance systems 1 have only a limited number of channels for connection of the local coils, it can be necessary to connect the local coils 12-37 with the available input channels of the magnetic resonance system 1 via a suitable switching matrix and for the switching matrix to be suitably controlled by, for example, the control device 7 in order to connect the current local coils with the input channels of the magnetic resonance system during an examination. Such switching matrices exhibit partial restrictions in the possible connections, such that every possible combination of local coils can be connected with the available input channels. In such a case the number of the possible coil groups can be limited or specific combinations of coil groups cannot be supported by the switching matrix. In such a case the processing unit 8 determines the coil groups such that the respective restrictions of the switching matrix are taken into account. For example, the number of the required coil groups can thus be reduced by two adjacent coil groups being combined into one group, and this resulting coil group is associated with the corresponding position of the support device 3.

By the use of the magnetic resonance system 1 presented above, a whole-body magnetic resonance examination can be implemented in a workflow procedure without local coils having to be rearranged or the magnetic resonance system controller having to be reset in-between. Moreover, a very short residence duration of the patient in the magnetic resonance system 1 is achieved, so a patient throughput through the magnetic resonance system can be increased and the patient must remain lying still in the magnetic resonance system with local coils arranged on him or her only for a short time.

Moreover, the method presented above and the magnetic resonance system presented above are also suitable for determination of transmission device groups, wherein the transmission device groups are respectively composed of a number of transmission devices instead of the reception coil devices.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for automatically selecting at least one coil device grouping for use in a magnetic resonance data acquisition sequence executed in a magnetic resonance apparatus comprising a plurality of coil devices operable in at least one of a magnetic resonance excitation mode and a magnetic resonance signal reception mode, and a support device configured to support a subject to be exposed to the magnetic resonance data acquisition sequence, said method comprising the steps of:

during execution of said magnetic resonance data acquisition sequence, moving said support device and the subject thereon continuously through a plurality of positions in said magnetic resonance apparatus;

for each coil device in said plurality of coil devices, associating a coil position of that coil device for each of the plurality of positions of said support device;

automatically electronically determining a plurality of coil groups so that each coil group includes a selected coil device from among said plurality of coil devices and, in any two of said coil groups that are respectively associated with two adjacent regions of said support device, including at least a same one of said coil devices, as said selected coil device to be present within each of said two coil groups and automatically electronically identifying a selected one of said coil groups from among said plurality of coil groups that is comprised of coil devices associated with respective positions of said support device that makes said selected one of said coil groups suitable for use during said magnetic resonance data acquisition sequence when said support device is at positions respectively associated with the coil devices in said selected one of said coil groups; and activating said selected one of said coil groups in order to acquire magnetic resonance data from all coil devices in said selected one of said coil groups in order to avoid data acquisition discontinuities when said support device is at said positions respectively associated with the plurality of coil devices in said selected one of said coil groups in order to avoid data acquisition discontinuities.

2. A method as claimed in claim 1 comprising:
also automatically determining a coil type of each of said coil devices, and using the respective types of the coils of the respective coil devices in automatically identifying said selected one of said coil groups.

3. A method as claimed in claim 1 comprising automatically electronically determining said plurality of coil groups before beginning execution of said magnetic resonance data acquisition sequence.

4. A method as claimed in claim 1 comprising automatically electronically determining said plurality of coil groups during execution of said magnetic resonance data acquisition sequence.

5. A method as claimed in claim 1 comprising automatically determining said plurality of coil groups by including said selected coil device therein in order to form a coil configuration selected from the group consisting of a head coil configuration, a chest coil configuration, a neck coil configuration, a leg coil configuration, a spinal column coil configuration, and a whole-body coil configuration.

6. A non-transitory computer-readable storage medium encoded with programming instructions for selecting at least one coil device grouping for use in a magnetic resonance data acquisition sequence executed in a magnetic resonance apparatus comprising a plurality of coil devices operable in at least one of a magnetic resonance excitation mode and a magnetic resonance signal reception mode, a support device configured to support a subject to be exposed to the magnetic resonance data acquisition sequence, and a drive unit that during execution of said magnetic resonance data acquisition sequence, moves said support device and the subject thereon continuously through a plurality of positions in said magnetic resonance apparatus, said non-transitory computer-readable storage medium being loadable into a computerized control unit of the magnetic resonance apparatus and said programming instructions causing said control unit, based on a coil position of each coil device associated with each of the plurality of positions of said support device, to:

automatically electronically determine a plurality of coil groups so that each coil group includes a selected coil device from among said plurality of coil devices, and in two of said coil groups that are respectively associated with two adjacent regions of said support device, include at least two of said coil devices that have overlapping fields of view, and automatically electronically identify a selected one of said coil groups from among said plurality of coil groups that is comprised of coil devices associated with respective positions of said support device that makes said selected one of said coil groups suitable for use during said magnetic resonance data acquisition sequence when said support device is at positions respectively associated with the coil devices in said selected one of said coil groups; and activate said selected one of said coil groups dependent on the position of the support device during execution of said magnetic resonance data acquisition sequence in order to acquire magnetic resonance data from all coil devices in said selected one of said coil groups when said support device is at said positions respectively associated with the coil devices in said selected one of said coil groups in order to avoid data acquisition discontinuities.

7. A method for automatically selecting at least one coil device grouping for use in a magnetic resonance data acquisition sequence executed in a magnetic resonance apparatus comprising a plurality of coil devices operable in at least one of a magnetic resonance excitation mode and a magnetic resonance signal reception mode, and a support device configured to support a subject to be exposed to the magnetic resonance data acquisition sequence, said method comprising the steps of:

during execution of said magnetic resonance data acquisition sequence, moving said support device and the subject thereon continuously through a plurality of positions in said magnetic resonance apparatus, including two adjacent positions of said support device comprising a first position and a second position of said support device;

with each coil device in said plurality of coil devices, associating a coil position of that coil device for each of the plurality of positions of said support device, by associating a first of said coil groups with said first position and a second of said coil groups with said second position, thereby giving said first of said coil groups a first detection region and said second of said coil groups a second detection region, with at least a portion of said first detection region overlapping at least a portion of said second detection region;

automatically electronically determining a plurality of coil groups so that each coil group includes a selected coil device from among said plurality of coil devices and automatically electronically identifying a selected one of said coil groups from among said plurality of coil groups that is comprised of a coil device or coil devices associated with respective positions of said support device that makes said selected one of said coil groups suitable for use during said magnetic resonance data acquisition sequence when said support device is at positions respectively associated with the coil devices in said one of said coil groups; and activating said selected one of said coil groups in order to acquire magnetic resonance data from all coil devices in said selected one of said coil groups when said support device is at said positions respectively associated with the coil devices in said selected one of said coil groups in order to avoid data acquisition discontinuities.

8. A method as claimed in claim 7 comprising automatically electronically combining said first of said two coil groups and said second of said two coil groups to form a combined coil group, and associating said combined coil group with said first and second positions of said support device.

9. A method as claimed in claim 1 comprising mounting said plurality of coil devices in said support device.

10. A method as claimed in claim 1 comprising mounting said plurality of coil devices in a subject-receiving opening of said magnetic resonance apparatus.

11. A magnetic resonance apparatus comprising:
a magnetic resonance scanner having a plurality of coil devices operable in at least one of a magnetic resonance excitation mode and a magnetic resonance signal reception mode, and a support device configured to support a subject to be exposed to a magnetic resonance data acquisition sequence implemented with the magnetic resonance scanner, and a drive unit that, during execution of said magnetic resonance data acquisition sequence, moves said support device and the subject thereon continuously through a plurality of positions in said magnetic resonance apparatus;
an input unit that, for each coil device in said plurality of coil devices, allows a user to associate a coil position of that coil device for each of the plurality of positions of said support device; and
a control unit configured to automatically electronically determine a plurality of coil groups so that each coil group includes a selected coil device from among said plurality of coil devices, and in two of said coil groups that are respectively associated with two adjacent regions of said support device, and to select at least a same one of said coil devices, as said selected coil device to be present within each of said two coil groups, and to automatically electronically identify a selected one of said coil groups from among said plurality of coil groups that is comprised of a coil device or coil devices associated with respective positions of said support device that makes said selected one of said coil groups suitable for use during said magnetic resonance data acquisition sequence when said support device is at positions respectively associated with the coil devices in said one of said coil groups, and to activate said selected one of said coil groups in order to acquire magnetic resonance data from all coil devices in said selected one of said coil groups when said support device is at said positions respectively associated with the plurality of coil devices in said selected one of said coil groups in order to avoid data acquisition discontinuities.

12. A magnetic resonance apparatus as claimed in claim 11 wherein said control unit is configured to automatically determine said plurality of coil groups by including said selected coil device therein to form a coil configuration selected from the group consisting of a head coil configuration, a chest coil configuration, a neck coil configuration, a leg coil configuration, a spinal column coil configuration, and a whole-body coil configuration.

13. A magnetic resonance apparatus comprising:
a magnetic resonance scanner having a plurality of coil devices operable in at least one of a magnetic resonance excitation mode and a magnetic resonance signal reception mode, and a support device configured to support a subject to be exposed to a magnetic resonance data acquisition sequence implemented with the magnetic resonance scanner, and a drive unit that, during execution of said magnetic resonance data acquisition sequence, moves said support device and the subject thereon continuously through a plurality of positions in said magnetic resonance apparatus;
a detection unit that, for each coil device in said plurality of coil devices, detects a coil position of that coil device for each of the plurality of positions of said support device; and
a control unit, supplied with the respective coil positions from said detection unit, said control unit being configured to automatically electronically determine a plurality of coil groups so that each coil group includes a selected coil device from among said plurality of coil devices, and in any two of said coil groups that are respectively associated with two adjacent regions of said support device, to include at least a same one of said coil devices, as said selected coil device to be present within each of said two coil groups, and to automatically electronically identify a selected one of said coil groups from among said plurality of coil groups that is comprised of coil devices at detected positions associated with respective positions of said support device that makes said selected one of said coil groups suitable for use during said magnetic resonance data acquisition sequence when said support device is at positions respectively associated with the coil devices in said one of said coil groups, and to activate said selected one of said coil groups in order to acquire magnetic resonance data from all coil devices in said selected one of said coil groups when said support device is at said positions respectively associated with the coil devices in said selected one of said coil groups in order to avoid data acquisition discontinuities.

14. A magnetic resonance apparatus as claimed in claim 13 wherein said control unit is configured to automatically determine said plurality of coil groups by including said selected coil device devices therein to form a coil configuration selected from the group consisting of a head coil configuration, a chest coil configuration, a neck coil configuration, a leg coil configuration, a spinal column coil configuration, and a whole-body coil configuration.

15. A non-transitory computer-readable storage medium encoded with programming instructions for selecting at least one coil device grouping for use in a magnetic resonance data acquisition sequence executed in a magnetic resonance apparatus comprising a plurality of coil devices operable in at least one of a magnetic resonance excitation mode and a magnetic resonance signal reception mode, a support device configured to support a subject to be exposed to the magnetic resonance data acquisition sequence, and a drive unit that during execution of said magnetic resonance data acquisition sequence, moves said support device and the subject thereon continuously through a plurality of positions in said magnetic resonance apparatus, said non-transitory computer-readable storage medium being loadable into a computerized control unit of the magnetic resonance apparatus and said programming instructions causing said control unit, based on a coil position of each coil device associated with each of the plurality of positions of said support device, to:
automatically electronically determine a plurality of coil groups so that each coil group includes a selected coil device from among said plurality of coil devices, and in two of said coil groups that are respectively associated with two adjacent regions of said support device, include at least a same one of said coil devices in each of said two coil groups, as said selected coil device to be present within and automatically electronically identify a selected one of said coil groups from among said plurality of coil groups that is comprised of coil devices associated with respective positions of said support device that makes said one of said coil groups suitable for use during said magnetic resonance data acquisition sequence when said support device is at positions respectively associated with the coil devices in said selected one of said coil groups; and
activate said selected one of said coil groups dependent on the position of the support device during execution of said magnetic resonance data acquisition sequence in order to acquire magnetic resonance data from all coil devices in said selected one of said coil groups when said support device is at said positions respectively associated with the coil devices in said selected one of said coil groups in order to avoid data acquisition discontinuities.

16. A method for automatically selecting at least one coil device grouping for use in a magnetic resonance data acquisition sequence executed in a magnetic resonance apparatus comprising a plurality of coil devices operable in at least one of a magnetic resonance excitation mode and a magnetic resonance signal reception mode, and a support device configured to support a subject to be exposed to the magnetic resonance data acquisition sequence, said method comprising the steps of:

during execution of said magnetic resonance data acquisition sequence, moving said support device and the subject thereon continuously through a plurality of positions in said magnetic resonance apparatus;

with each coil device in said plurality of coil devices, associating a coil position of that coil device for each of the plurality of positions of said support device;

automatically detecting, for each coil device in said plurality of coil devices, a coil position of that coil device for each of the plurality of positions of said support device;

automatically electronically determining a plurality of coil groups so that each coil group includes a selected coil device from among said plurality of coil devices and, in any two of said coil groups that are respectively at detected positions for two adjacent regions of said support device, including at least a same one of said coil devices in each of said two coil groups, as said selected coil device to be present within and automatically electronically identifying a selected one of said coil groups from among said plurality of coil groups that is comprised of coil devices associated with respective positions of said support device that makes said selected one of said coil groups suitable for use during said magnetic resonance data acquisition sequence when said support device is at positions respectively associated with the coil devices in said selected one of said coil groups; and activating said selected one of said coil groups in order to acquire magnetic resonance data from all coil devices in said one of said coil groups when said support device is at said positions respectively associated with the coil devices in said selected one of said coil groups in order to avoid data acquisition discontinuities.

17. A method as claimed in claim 16 comprising automatically determining said plurality of coil groups by including said selected coil device therein to form a coil configuration selected from the group consisting of a head coil configuration, a chest coil configuration, a neck coil configuration, a leg coil configuration, a spinal column coil configuration, and a whole-body coil configuration.

18. A method for automatically selecting at least one coil device grouping for use in a magnetic resonance data acquisition sequence executed in a magnetic resonance apparatus comprising a plurality of coil devices operable in at least one of a magnetic resonance excitation mode and a magnetic resonance signal reception mode, and a support device configured to support a subject to be exposed to the magnetic resonance data acquisition sequence, said method comprising the steps of:

during execution of said magnetic resonance data acquisition sequence, moving said support device and the subject thereon continuously through a plurality of positions in said magnetic resonance apparatus, including two adjacent positions of said support device comprising a first position and a second position of said support device;

with each coil device in said plurality of coil devices, associating a coil position of that coil device for each of the plurality of positions of said support device, by associating a first of said coil groups with said first position and a second of said coil groups with said second position, thereby giving said first of said coil groups a first detection region and said second of said coil groups a second detection region, with at least a portion of said first detection region overlapping at least a portion of said second detection region;

automatically detecting, for each coil device in said plurality of coil devices, a coil position of that coil device for each of the plurality of positions of said support device;

automatically electronically determining a plurality of coil groups so that each coil group includes a selected coil device from among said plurality of coil devices and automatically electronically identifying a selected one of said coil groups from among said plurality of coil groups that is comprised of a coil device or coil devices at detected positions for respective positions of said support device that makes said one of said coil groups suitable for use during said magnetic resonance data acquisition sequence when said support device is at positions respectively associated with the coil devices in said selected one of said coil groups; and activating said one of said coil groups in order to acquire magnetic resonance data from all coil devices in said selected one of said coil groups when said support device is at said positions respectively associated with the coil devices in said selected one of said coil groups in order to avoid data acquisition discontinuities.

19. A method as claimed in claim 18 comprising automatically determining said plurality of coil groups by including said selected coil device therein to form a coil configuration selected from the group consisting of a head coil configuration, a chest coil configuration, a neck coil configuration, a leg coil configuration, a spinal column coil configuration, and a whole-body coil configuration.

20. A magnetic resonance apparatus comprising:

a magnetic resonance scanner having a plurality of coil devices operable in at least one of a magnetic resonance excitation mode and a magnetic resonance signal reception mode, and a support device configured to support a subject to be exposed to a magnetic resonance data acquisition sequence implemented with the magnetic resonance scanner, and a drive unit that, during execution of said magnetic resonance data acquisition sequence, moves said support device and the subject thereon continuously through a plurality of positions in said magnetic resonance apparatus;

an input unit that, for each coil device in said plurality of coil devices, allows a user to associate a coil position of that coil device for each of the plurality of positions of said support device; and a control unit configured to automatically electronically determine a plurality of coil groups so that each coil group includes a selected coil device from among said plurality of coil devices, and in two of said coil groups that are respectively associated with two adjacent regions of said support device, to include at least two of said coil devices respectively in the respective two coil groups, as said selected coil device to be present within that have overlapping fields of view, and to automatically electronically identify a selected one of said coil groups from among said plurality of coil groups that is comprised of a coil device or coil devices associated with respective positions of said support device that makes said one of said coil groups suitable for use during said magnetic resonance data acquisition sequence when said support device is at positions respectively associated with the coil devices in said selected one of said coil groups, and to activate said selected one of said coil groups in order to acquire magnetic resonance data from all coil devices in said selected one of said coil groups when said support device is at said positions respectively associated with the coil devices in said selected one of said coil groups in order to avoid data acquisition discontinuities.

21. A magnetic resonance apparatus as claimed in claim 20 wherein said control unit is configured to determine said plurality of coil groups by including said selected coil device therein to form a coil configuration selected from the group consisting of a head coil configuration, a chest coil configuration, a neck coil configuration, a leg coil configuration, a spinal column coil configuration, and a whole-body coil configuration.

22. A magnetic resonance apparatus comprising:

a magnetic resonance scanner having a plurality of coil devices operable in at least one of a magnetic resonance excitation mode and a magnetic resonance signal reception mode, and a support device configured to support a subject to be exposed to a magnetic resonance data acquisition sequence implemented with the magnetic resonance scanner, and a drive unit that, during execution of said magnetic resonance data acquisition sequence, moves said support device and the subject thereon continuously through a plurality of positions in said magnetic resonance apparatus;

a detection unit that, for each coil device in said plurality of coil devices, detects a coil position of that coil device for each of the plurality of positions of said support device; and a control unit, supplied with the respective coil positions from said detection unit, said control unit being configured to automatically electronically determine a plurality of coil groups so that each coil group includes a selected coil device from among said plurality of coil devices, and in two of said coil groups that are respectively associated with two adjacent regions of said support device, include at least two of said coil devices that have overlapping fields of view, and to automatically electronically identify a selected one of said coil groups from among said plurality of coil groups that is comprised of coil devices at detected positions associated with respective positions of said support device that makes said selected one of said coil groups suitable for use during said magnetic resonance data acquisition sequence when said support device is at positions respectively associated with the coil devices in said selected one of said coil groups, and to activate said selected one of said coil groups in order to acquire magnetic resonance data from all coil devices in said selected one of said coil groups when said support device is at said positions respectively associated with the coil devices in said one of said coil groups in order to avoid data acquisition discontinuities.

23. A method as claimed in claim 22 comprising automatically determining said plurality of coil groups by including said selected said coil device therein to form a coil configuration selected from the group consisting of a head coil configuration, a chest coil configuration, a neck coil configuration, a leg coil configuration, a spinal column coil configuration, and a whole-body coil configuration.

* * * * *